(12) United States Patent
Kenly et al.

(10) Patent No.: US 11,940,827 B1
(45) Date of Patent: Mar. 26, 2024

(54) MANAGEMENT OF PATH SELECTION IN A MULTI-PATH CONTROL SYSTEM

(71) Applicant: CIRRUS LOGIC INTERNATIONAL SEMICONDUCTOR LTD., Edinburgh (GB)

(72) Inventors: Stewart G. Kenly, Austin, TX (US); Vamsikrishna Parupalli, Austin, TX (US); Nishant Jain, Austin, TX (US); Eric B. Smith, Austin, TX (US)

( * ) Notice: Subject to any disclaimer, the term of this patent is extended or adjusted under 35 U.S.C. 154(b) by 0 days.

(21) Appl. No.: 18/078,292

(22) Filed: Dec. 9, 2022

(51) Int. Cl.
*H03K 3/017* (2006.01)
*G05F 1/56* (2006.01)
*H02P 23/00* (2016.01)

(52) U.S. Cl.
CPC .............. *G05F 1/56* (2013.01); *H03K 3/017* (2013.01); *H02P 23/00* (2013.01)

(58) Field of Classification Search
None
See application file for complete search history.

(56) References Cited

U.S. PATENT DOCUMENTS

| | | | |
|---|---|---|---|
| 4,446,440 A * | 5/1984 | Bell .......................... | H03F 3/72 330/297 |
| 5,550,450 A | 8/1996 | Palko et al. | |
| 5,838,515 A * | 11/1998 | Mortazavi ............. | H02P 25/034 360/78.12 |
| 6,392,484 B1 * | 5/2002 | Takita ..................... | H03F 3/217 330/10 |
| 6,501,609 B2 * | 12/2002 | Saito ..................... | G11B 5/5521 360/78.04 |
| 6,757,129 B2 * | 6/2004 | Kuroiwa .............. | G11B 5/5547 360/77.02 |
| 6,975,479 B2 * | 12/2005 | Kokami ................. | G11B 5/022 360/77.02 |
| 6,995,537 B1 | 2/2006 | Plutowski et al. | |
| 7,224,135 B1 | 5/2007 | Mengoli | |

(Continued)

FOREIGN PATENT DOCUMENTS

| | | |
|---|---|---|
| CH | 658963 A5 | 12/1986 |
| EP | 0577901 A1 | 1/1994 |

OTHER PUBLICATIONS

International Search Report and Written Opinion in PCT/US2023/080603 dated Jan. 19, 2024, 8 pages (pp. 1-8 in pdf).

*Primary Examiner* — Thomas J. Hiltunen
(74) *Attorney, Agent, or Firm* — Mitch Harris, Atty at Law, LLC; Andrew M. Harris (57) ABSTRACT

An electronic control system provides selectable path operation, such as linear and pulse-width modulated (PWM) operation and provides path transition management to improve operation. The system supplies a current or a voltage to a load in response to an input signal or value and includes an output driver, and multiple selectable control paths. The system includes a control circuit that selects between the first control path and the second control path in response to a path selection indication to drive the output driver. The system may include an evaluator that determines the path selection indication in conformity with an amplitude and a slew rate of the input. One or all of the control paths may have a response time to changes in the input signal or value, and the control circuit may delay switching from the second control path to the first control path to compensate for the response time.

22 Claims, 7 Drawing Sheets

(56) References Cited

U.S. PATENT DOCUMENTS

| | | | |
|---|---|---|---|
| 8,716,959 B2 | 5/2014 | David et al. | |
| 9,178,461 B2 * | 11/2015 | Miura | H02P 25/034 |
| 9,219,414 B2 | 12/2015 | Shao | |
| 9,654,689 B2 | 5/2017 | Gleason et al. | |
| 9,735,574 B2 | 8/2017 | Tournatory et al. | |
| 10,116,209 B2 * | 10/2018 | Bizjak | H02M 3/156 |
| 10,181,845 B1 | 1/2019 | Das et al. | |
| 10,637,423 B2 | 4/2020 | Vellanki et al. | |
| 10,996,634 B2 | 5/2021 | Yao et al. | |
| 11,070,177 B2 | 7/2021 | Singh et al. | |
| 11,115,046 B2 | 9/2021 | Parupalli et al. | |
| 2022/0329216 A1 | 10/2022 | Yin et al. | |
| 2022/0337181 A1 | 10/2022 | Parupalli et al. | |
| 2023/0128810 A1 * | 4/2023 | Parupalli | H02M 1/0009 |
| | | | 318/503 |
| 2023/0130120 A1 * | 4/2023 | Parupalli | H02M 7/53873 |
| | | | 324/76.11 |

* cited by examiner

MANAGEMENT OF PATH SELECTION IN A MULTI-PATH CONTROL SYSTEM

BACKGROUND

1. Field of Disclosure

The field of representative embodiments of this disclosure relates to systems such as amplifiers, motor drivers and other power output electronics that have multiple selectable control paths, and in particular to a method and system that manage the path selection.

2. Background

Audio amplifiers, motor controllers and other power output drivers such as those for driving haptic feedback devices, may be provided with high efficiency using a class-D type output, or low distortion, noise and offset using a linear amplifier. In particular, a pulse-width modulated (PWM) output stage has been used in combination with a linear output stage to provide high-efficiency for large excursions and low distortion and offset error by transitioning to a linear control once the output is close to a commanded value. Such operation enhances accuracy by providing a less noisy environment when the system is in a linear operation mode, while providing high power efficiency for large excursions when the system is in the PWM operating mode.

However, while both PWM control and linear control may be implemented in a system, the optimum selection of the path and timing of the transition changes may not be ideal when selected entirely according to a current output value or input signal level.

Therefore, it would be advantageous to operate a multi-path control system that better optimizes the selection between the multiple control paths and the timing of the selections.

SUMMARY

Improved multi-path control system operation is accomplished in systems, integrated circuits including the systems and their methods of operation.

The system is a system for supplying a current or a voltage to a load in response to an input signal or value and includes an output driver for supplying the current or the voltage to the load, a first control path that receives the input signal or value and has an output coupled to an input of the output driver, a second control path that receives the input signal or value and has an output coupled to an input of the output driver and a control circuit that selects between the first control path and the second control path in response to a path selection indication to provide the output to the input of the output driver.

In some example embodiments, the system includes an evaluator that receives the input signal or value and determines the path selection indication in conformity with an amplitude and a slew rate of the input signal or value. In some example embodiments, at least one of the first control path or the second control path has a response time to changes in the input signal or value, and the control circuit delays switching from the second control path to the first control path to compensate for the response time.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses systems, circuits and integrated circuits that include improved multi-path control systems and their methods of operation. The system is a system for supplying a current or a voltage to a load in response to an input signal or value and includes an output driver for supplying the current or the voltage to the load, a first control path that receives the input signal or value and has an output coupled to an input of the output driver, a second control path that receives the input signal or value and has an output coupled to an input of the output driver and a control circuit that selects between the first control path and the second control path in response to a path selection indication to provide the output to the input of the output driver. In some example embodiments, at least one of the first control path or the second control path has a response time to changes in the input signal or value, and the control circuit delays switching from the second control path to the first control path to compensate for the response time. While the following description is provided with reference to block diagrams, it is understood that the description included therein are applicable to a process that may be implemented, in part, by a digital signal processor, microprocessor, or controller core executing a computer program product according to an embodiment of the disclosure as described in further detail below.

Figure 1:
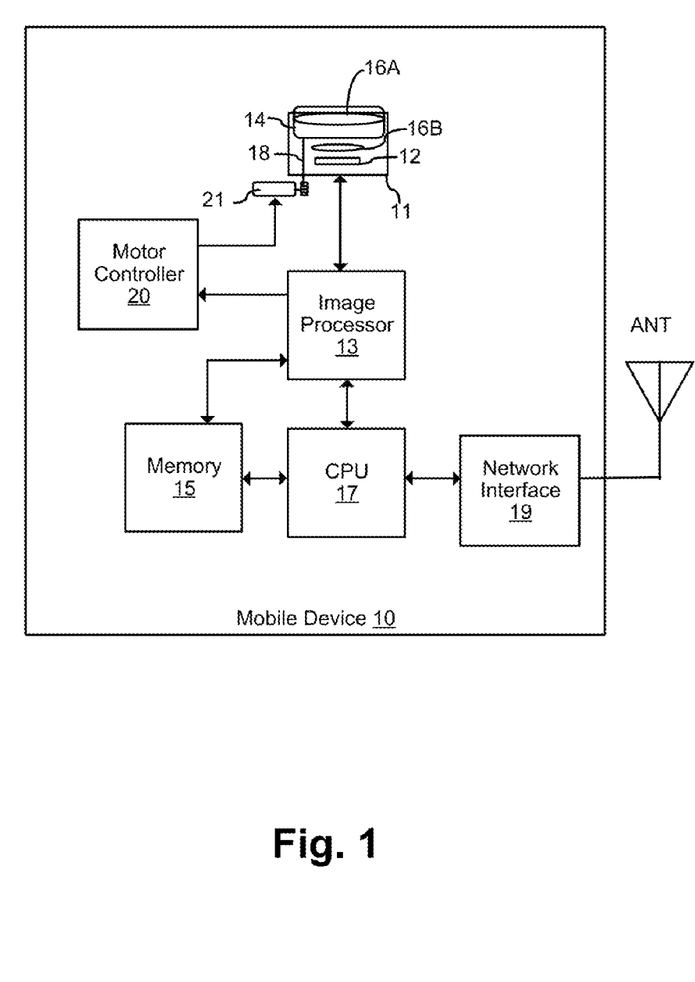
FIG. 1 is a block diagram illustrating an example mobile device 10, in accordance with an embodiment of the disclosure.

Referring now to FIG. 1, a block diagram of an example mobile device 10 implementing an example multi-path electronic control system is shown, in accordance with an embodiment of the disclosure. Example mobile device 10 may be a wireless mobile telephone, tablet, notebook computer, or a similar device. Alternatively, mobile device may be a digital camera or other system that incorporates a position-controlled image sensor. Operation of mobile device 10 is controlled by a central processing unit (CPU) 17, which may be a microcontroller, microprocessor or other processor core, such as a processor core in a dedicated system-on-chip (SOC) implementation. CPU 17 is coupled to a memory 15 that stores program instructions forming a computer-program product, program data and other data such as media, including digital photographs. Memory 15 may include both non-volatile and dynamic storage elements. A network interface 19 provides for connection of mobile device 10 to a wireless network via an antenna ANT, but is not required for implementation of embodiments according to the disclosure, for example an electronic motor control system in a camera providing only a wired interface. A separate image processor 13 is also coupled to memory 15, and memory may comprise separate storage for program instructions forming another computer-program product, and data that may not be accessed directly by CPU 17. Image processor 13 provides an interface for receiving data from an image sensor 12 of a camera 11 within mobile device 10 and also provides an interface to a motor controller 20 that controls at least one motor 21 that positions a movable lens 16A or multiple lenses of camera 11, and/or image sensor 12 of camera 11, responsive to commands from image processor 13. In the illustrated embodiment, movable lens 16A is positioned by a mount 14, coupled to motor 21 via a mechanical linkage 18. A mount of image sensor and additional motors (not shown) may be provided to move image sensor 12 in one or more axes, in response to the commands. The commands are generally motor current commands to control the speed of motor 21, and any additional motors, as computed by CPU 17 or image processor 13, which may provide zoom, auto-focus and image stabilization functions, by moving lens 16 and/or image sensor 13. Another fixed lens 16B receives an image from movable lens 16A to produce an image of the subject of a photograph or other image processing subject on image sensor 12.

Figure 2:
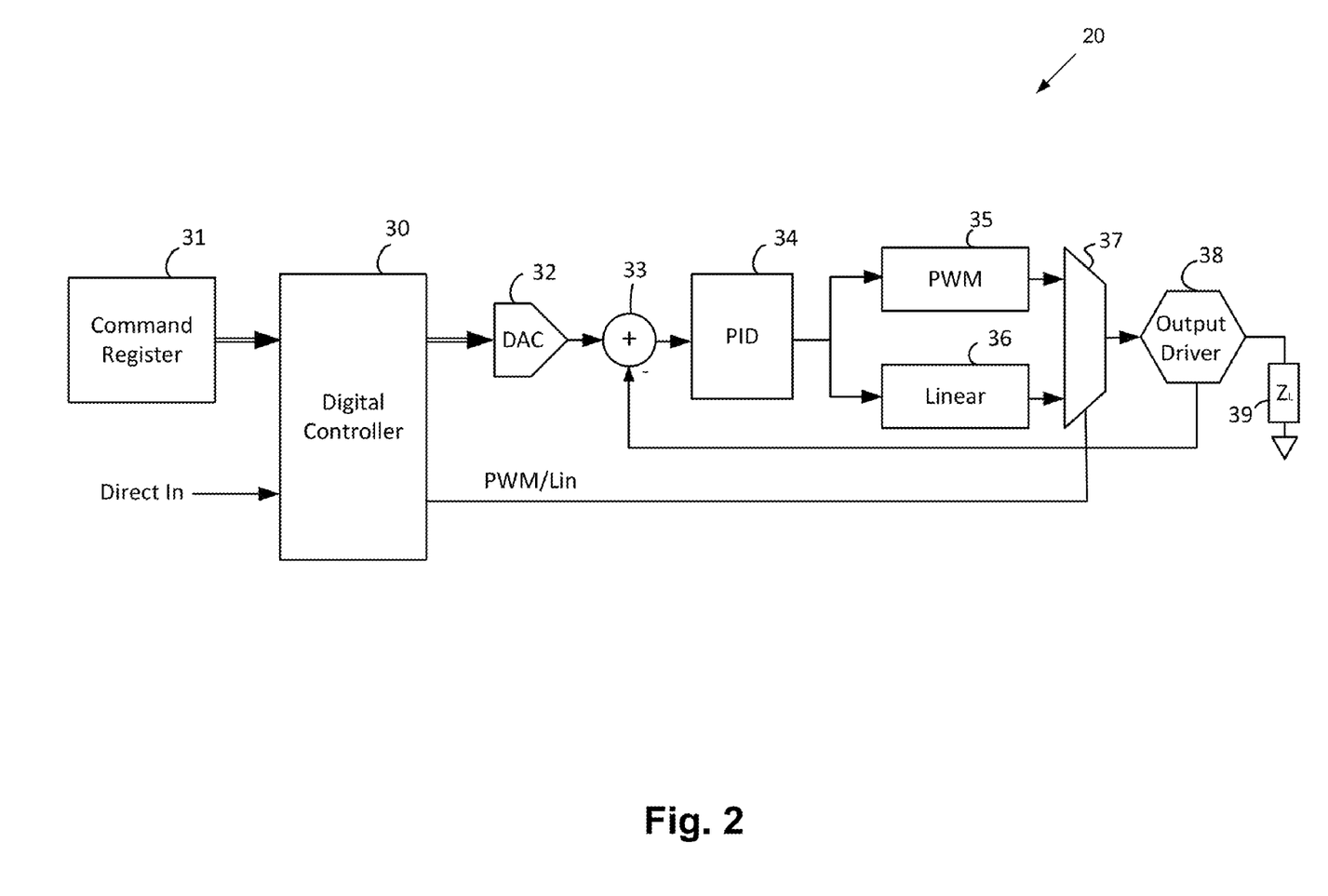
FIG. 2 is a block diagram illustrating an example motor controller 20 of FIG. 1, in accordance with an embodiment of the disclosure.

Referring now to FIG. 2, a block diagram illustrating an example motor controller 20 of FIG. 1 is shown, in accordance with an embodiment of the disclosure. A digital controller 30 receive input values from a command register 31 that control the current supplied by an output driver 38 to a load 39. While mobile device 10 described above implements a motor controller 20, the system depicted in FIG. 2 may provide outputs to loads other than a motor. For example, motor controller 20 may control a current provided to an electromechanical transducer, such as a haptic device or a loudspeaker. Digital controller 30 generates ramp waveforms that ramp the level and the polarity of the supplied current between command endpoints provided from command register 31. Digital controller 30 also performs comparisons of the current level of the ramp waveforms to various thresholds, to determine if saturation may occur in a pulse-width modulated (PWM) path 35 and to make decisions about path selection control changes based on the level and sign of the ramp waveform corresponding to the output current supplied to load 39. Digital controller 30 generates a control signal PWM/Lin that operates a selector 37 that selects between the outputs of pulse-width modulated (PWM) path 35 and a linear control path 36 according to an output of a state machine that will be described in further detail below. The current ramp values generated by digital controller 30 are converted to an analog signal by a digital-to-analog converter (DAC) 32 that, in the depicted embodiment, provides an input to a proportional-integral-derivative (PID) control block 34 that operates on the output of a combiner that combines the output of DAC 32 with a feedback signal feedback provided from output driver 38. PID control block 34 may be replaced by a proportional-integral (PI) control block or another suitable type of controller, in accordance with other embodiments of motor controller 20.

Figure 3:
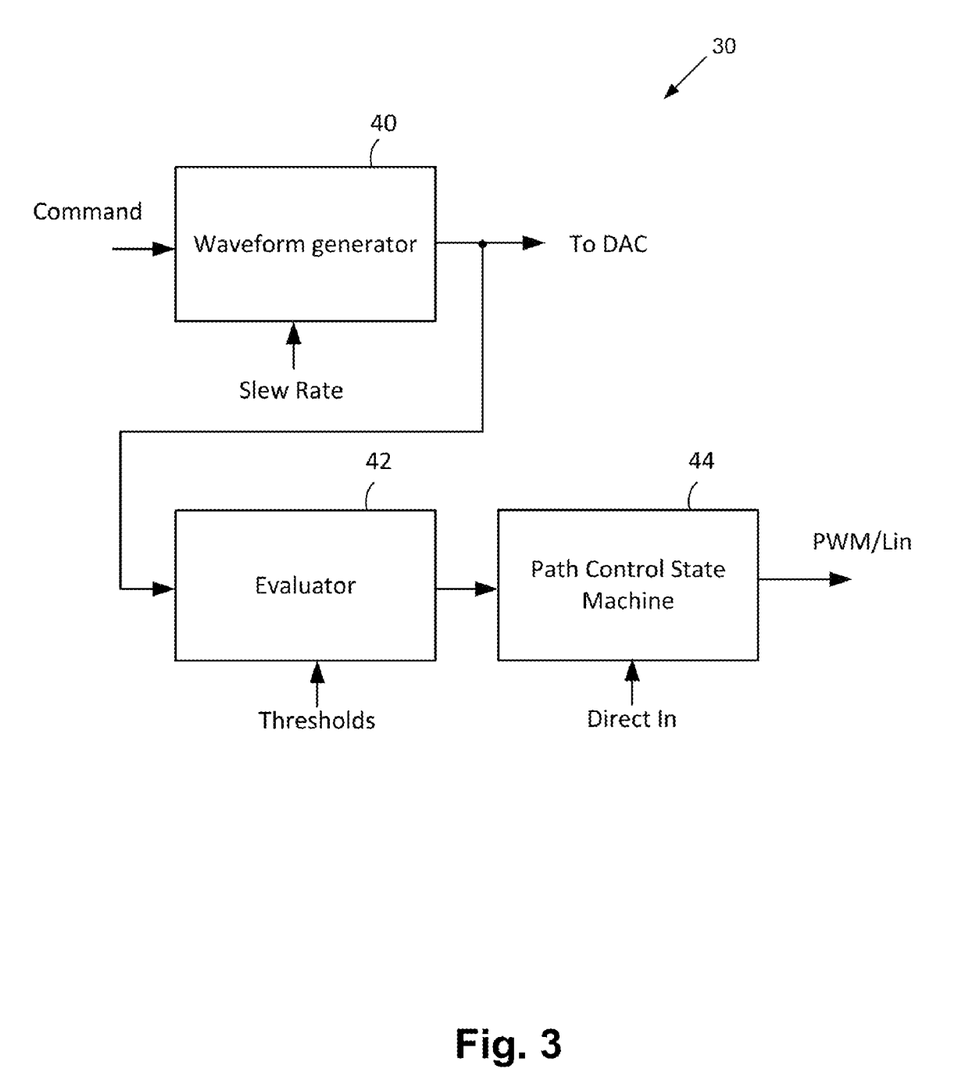
FIG. 3 is a block diagram of an example digital controller 30 that may be used in motor controller 20 of FIG. 1 and FIG. 2, in accordance with an embodiment of the disclosure.

Referring now to FIG. 3, a block diagram of an example digital controller 30 that may be used in motor controller 20 of FIG. 1 and FIG. 2 is shown, in accordance with an embodiment of the disclosure. Digital controller 30 may be implemented by one or more algorithms executed by CPU 17 of FIG. 1 and stored as a program in memory 15 of FIG. 1 and forming a computer-program product in accordance with an embodiment of the disclosure. Alternatively, digital controller 30 may be a logic-based controller, or another processor that executes the computer-program product implementing the algorithms, such as a dedicated microcontroller core. Input Command represents the input values received from command register 31 in motor controller 20 of FIG. 2, and is provided to a waveform generator 40 that generates the current value ramp waveform described above. A control value Slew Rate may be adjustable, and may control the rate of change of the current ramp waveform. The output of waveform generator 40 is provided to the input of DAC 32 in motor controller 20 of FIG. 2 and also to an input of an evaluator block 42 that compares the instantaneous value of the commanded current level waveform to several threshold values Thresholds, which may also be adjustable to set the levels at which path changes will occur by default. A path control state machine 44 receives the outputs of evaluator 42 and controls path selection signal Path Select according to the outputs of evaluator 42 and a control signal providing a direct input for path selection Direct In. Path control state machine 44, may selectively override the default path selection both in timing and selection of a particular path, as will be described in further detail below.

Figure 4:
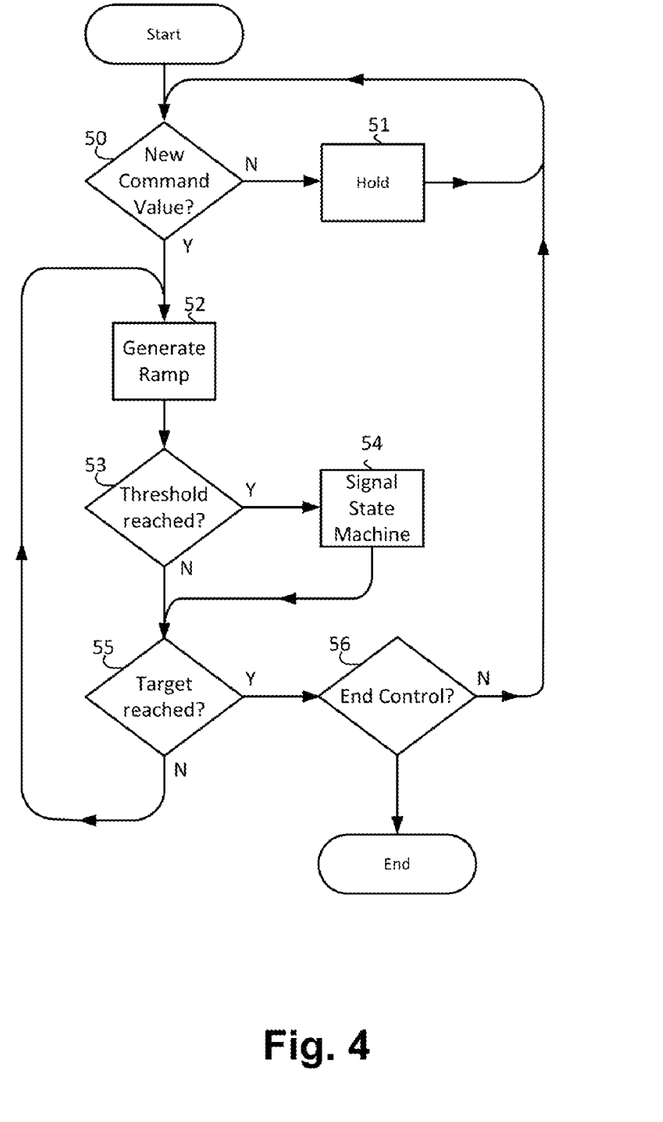
FIG. 4 is a flowchart illustrating an example of operation of motor control circuit 20 of FIG. 2, in accordance with an embodiment of the disclosure.
Figure 6:
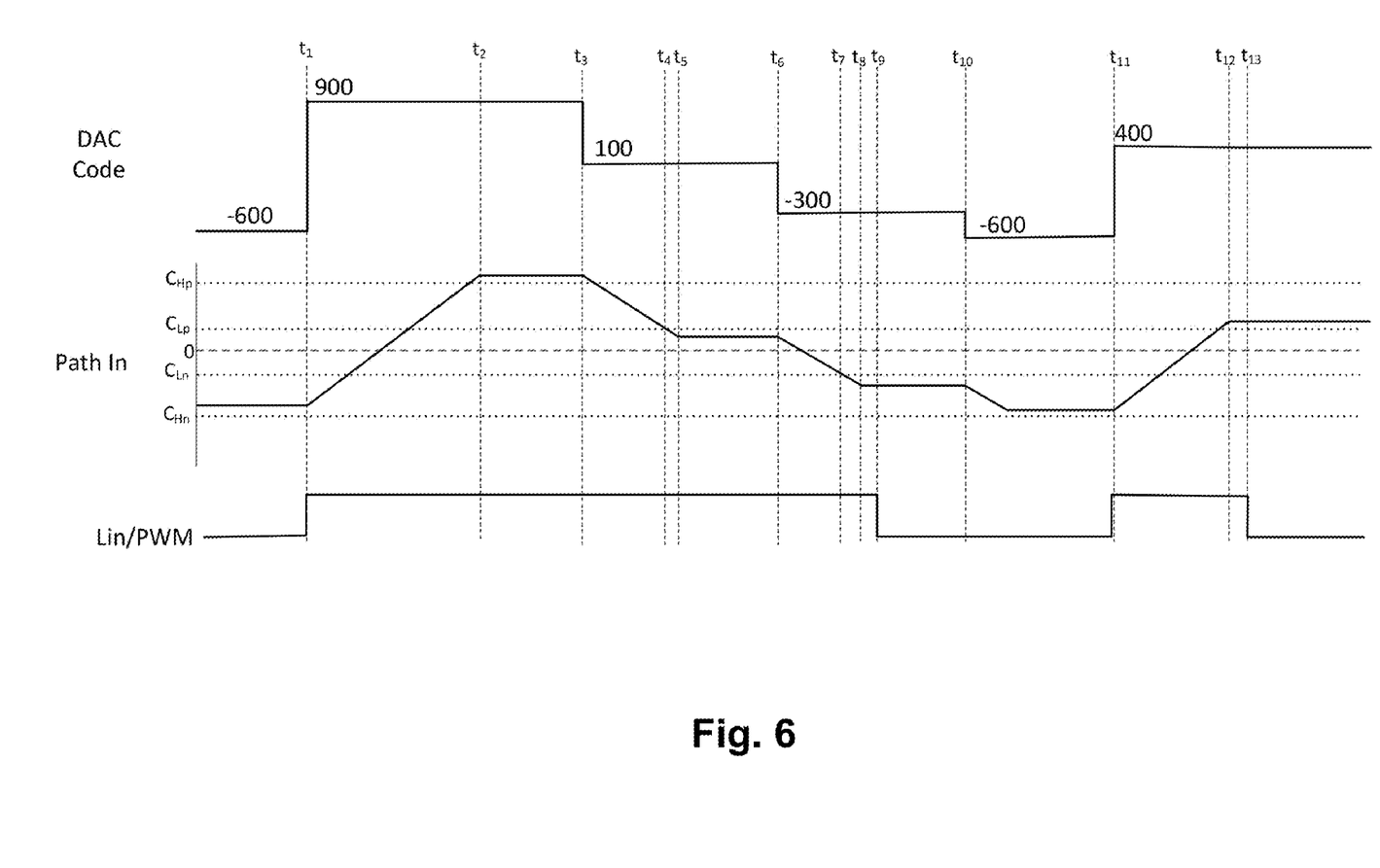
FIG. 6 is a signal waveform diagram illustrating an example of operation of motor control circuit 20 of FIG. 2, in accordance with an embodiment of the disclosure.

Referring additionally to FIG. 4, a flowchart illustrating an example of operation of motor control circuit 20 of FIG. 2 is shown, in accordance with an embodiment of the disclosure. Until waveform generator 40 receives a new motor current command value (decision 50), the previous current level is held (step 51). When waveform generator 40 receives a new motor current command value (decision 50), a digital ramp waveform is generated (step 52) to ramp the input of DAC 32 of FIG. 2 to the next current command level, which DAC 32 converts to an analog output ramp waveform. Threshold values applied to the ramp waveform define the boundaries between different operating regions of example motor control 20, as shown in FIG. 6, and as described in further detail below. In order to provide precise control of motor position, the lowest current values select linear control path 36 to drive output driver 38, and two regions are delineated on either side of the zero-current level by two lower threshold command values $C_{Ln}$ and $C_{Lp}$, which, in the specific examples described below, may be −200 and +200. Outside of the linear operation window described by threshold command values $C_{Ln}$ and $C_{Lp}$, PWM control path 35 is selected for efficiency, up to values at which PWM saturation may occur, which is informed by a pair of upper threshold command values $C_{Hn}$ and $C_{Hp}$, beyond which linear control path 36 is selected to avoid a PWM saturation condition. When one of the threshold values is reached by the ramp waveform (decision 53), path control state machine 44 is informed (step 54), and may perform various overrides of the path selection described above with respect to the threshold command values, as described in further detail below. Until the target command value is reached (decision 55), waveform generator 40 continues to generate the ramp waveform, repeating steps 52-55. Once the target command value is reached (decision 55), waveform generator 40 idles the current level at the target value, repeating the process for step 50 through step 55 until a new command value is received at decision 50, until motor control is ended (decision 56).

Figure 5:
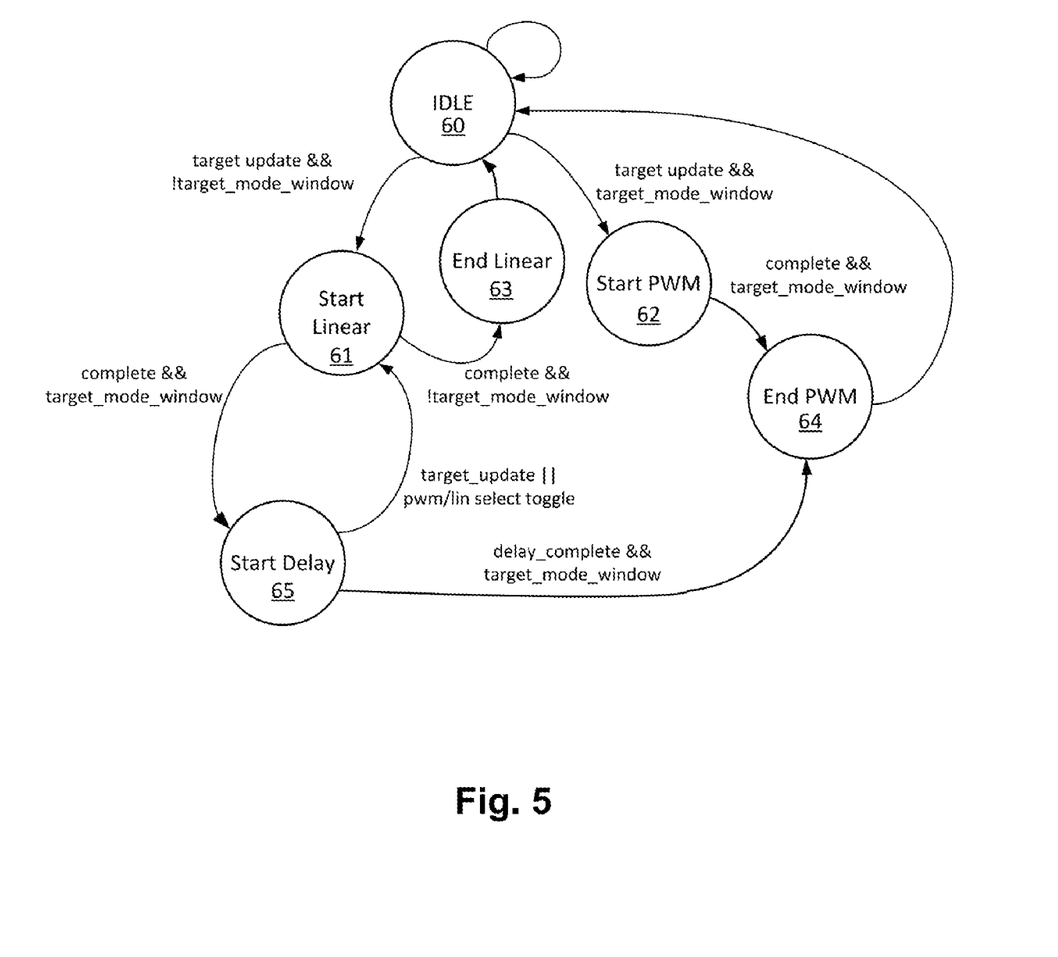
FIG. 5 is a state diagram illustrating an example of operation of path control state machine 44 of FIG. 3, in accordance with an embodiment of the disclosure.

Referring now to FIG. 5, a state diagram illustrates an example of operation of path control state machine 44 of FIG. 3, in accordance with an embodiment of the disclosure. Path control state machine 44 idles at the current target value until a target code update is received (state 60), in which the output of the driver is enabled, holding the present current target level and waiting for an updated code value, indicating a new target current level. Five flags, which are cleared in state 60, control state transitions:

target_update—asserted when the target current control code value is updated.
  complete—asserted when the target value has been reached by the ramp.
  target_mode_window—set dynamically during a ramp, when path control state machine 44 is switching out of one of the current level regions between thresholds $C_{Ln}$, $C_{Lp}$, $C_{Hn}$ and $C_{Hp}$, i.e., the current level will cross one of thresholds $C_{Ln}$, $C_{Lp}$, $C_{Hn}$ and $C_{Hp}$, which necessitates a selection of the linear control path, according to the control scheme described above.
  pwm/lin_select_toggle—set dynamically when path selection control signal PWM/Lin changes state.
  delay_complete—set when a delay due to a change in path selection is complete.

When a target update is received, target_update is set, and path control state machine 44 determines whether the endpoint of a new ramp is in a same PWM range as the currently held target current value, i.e., the selected control path is already PWM and the endpoint does not leave the present PWM range. If so, path control state machine 44 maintains selection of PWM control path 35 (state 62). Once flag complete is set, indicating that the target value has been reached by the ramp, an endpoint within a PWM operating range has been reached at state 64 and operation returns to the idle state (state 60) maintaining PWM operation.

If the endpoint of the ramp is not in the same PWM range as the start point of the ramp, path control state machine 44 selects linear operation by setting path selection control signal PWM/Lin select the linear control path, and state 61 is entered to start linear control operation. Once the ramp is completed by reaching the new target as indicated by a flag complete, if flag target_mode_window is set, a delay is started in state 65. If a target update is received during the delay period in state 65, or flag pwm/lin_select_toggle is set, indicating that the delay expired and the state of path selection control signal PWM/Lin has now changed state, operation returns to state 61 until both flag complete is set and flag target_mode_window is reset, indicating that the ramp is complete and the linear control path should remain selected. Operation then proceeds to state 63 and returns to idle state 60, remaining in the linear control mode. Otherwise, if flag delay_complete indicates that the delay period has expired and flag target_mode_window is set indicating that path control state machine should change selection of the control path, resulting in a selection of the PWM control path, operation proceeds to state 64, and operation then returns to the idle state (state 60) maintaining PWM operation. If during (linear) operation in state 61, the ramp is completed by reaching the new target as indicated by a flag complete and flag target_mode_window is not set, control proceeds directly to state 63 without a delay, and operation returns to idle state 60, with the linear control path remaining selected.

Referring additionally to FIG. 6, a signal waveform diagram illustrates an example of operation of motor control circuit 20 of FIG. 2, in accordance with an embodiment of the disclosure. The topmost waveform, DAC Code illustrates a sequence of discrete codes corresponding to current levels provided from DAC 32, but as received as value Command at the input of waveform generator 40, and which are the values received from command register 31 in FIG. 2. The middle waveform Path In shows the ramp segments generated from DAC Code by waveform generator 40 and provided as input to PID control block 34, and which have endpoints extending from the previous value of waveform DAC Code to a target value commanded by the new value of DAC Code that initiated the ramp portion. After a target value has been reached, and until another code represented by waveform DAC Code has been received, the value provided as input to PID control block 34 remains constant. The bottom waveform Lin/PWM illustrates the output control signal provided from path control state machine 44, and illustrates various over-rides of the default threshold path selections that are commanded by evaluator 42, according to threshold values Thresholds. In the depicted embodiment, four thresholds $C_{Ln}$, $C_{Lp}$, $C_{Hn}$ and $C_{Hp}$ are illustrated, where high thresholds $C_{Hn}=-800$ and $C_{Hp}=800$ are thresholds that indicate that PWM saturation may occur for greater current magnitudes, so linear operation should be commanded to avoid PWM saturation, and low thresholds $C_{Ln}=-200$ and $C_{Lp}=200$ are thresholds below which linear mode should be entered, as the current levels are low indicating a more precise (and slower) approach to a zero (or low) current level may be occurring.

However, always using the lower thresholds $C_{Ln}$, $C_{Lp}$ to switch paths may not be desirable during a transition through linear mode and to a target code for which PWM mode would be selected. Under the above-described condition, path control state machine 44 changes the selected mode to linear at the beginning of the ramp segment, and maintains linear operation, overriding any path selection indicated by the thresholds, until the target value has been reached, and after a delay to allow PID control block 34 to settle at the new value has occurred. When the current code value and the target code value are both between $C_{Lp}$ and $C_{Hp}$ or are both between $C_{Ln}$ and $C_{Hn}$, there will be no indication to switch to linear mode during the transition, and PWM mode will be maintained throughout the transition. Finally, when a ramp is initiated while system 20 is in linear mode, linear mode is maintained until the target is reached and only switched to PWM mode if the target is in the PWM selection range, i.e., if the target code is between $C_{Lp}$ and $C_{Hp}$ or between $C_{Hn}$ and $C_{Ln}$, PWM mode is selected after a delay to allow PID control block 34 to settle at the new value before switching to PWM mode.

At the beginning of the graph, DAC Code assumes an initial value of −600, PWM mode is initially selected, and the output Path In of waveform generator 40 is constant at −600. At a time waveform generator receives a commanded current level of 900 and begins to ramp to a value of 900 at the slew rate specified by input value Slew Rate. To manage the transition, path control state machine 44 asserts path selection control signal Lin/PWM to select the linear control path which remains selected throughout the transition ramp. After the target of 900 is reached, output Path In assumes a constant value of 900 at a time $t_2$, and the linear control path remains selected, since the target value of 900 exceeds threshold $C_{Hp}$. At a time $t_3$, a new target of 100 is received, and the linear control path remains selected, since the target is between $C_{Lp}$ and $C_{Ln}$, even though the ramp value is above $C_{Lp}$ until a time $t_4$, which is an override of the threshold-selected path. At a time $t_5$, the current level idles at 100 and the linear control path remains selected. At a time $t_6$, a new target of −300 is received, and the selected path remains the linear control path until a time $t_8$, when the target is reached, even though, at time $t_7$, threshold $C_{Ln}$ is crossed, representing another override. Before the PWM control path is selected, an additional delay time between time to and a time $t_9$ is applied before path selection control signal Lin/PWM is de-asserted to select the PWM control path. At a time $t_{10}$, a new target of −600 is received, which is in the same region between $C_{Ln}$ and $C_{Hn}$, so the PWM control path remains selected. At a time $t_{11}$, a new target of 400 is received, which is a different PWM selection region between $C_{Lp}$ and $C_{Hp}$, so path selection control signal Lin/PWM is asserted to select the linear control path, and the linear control path remains selected until the target is reached at a time $t_{12}$ and an additional delay has expired before path selection control signal Lin/PWM is de-asserted to select the PWM control path at a time 113.

Figure 7:
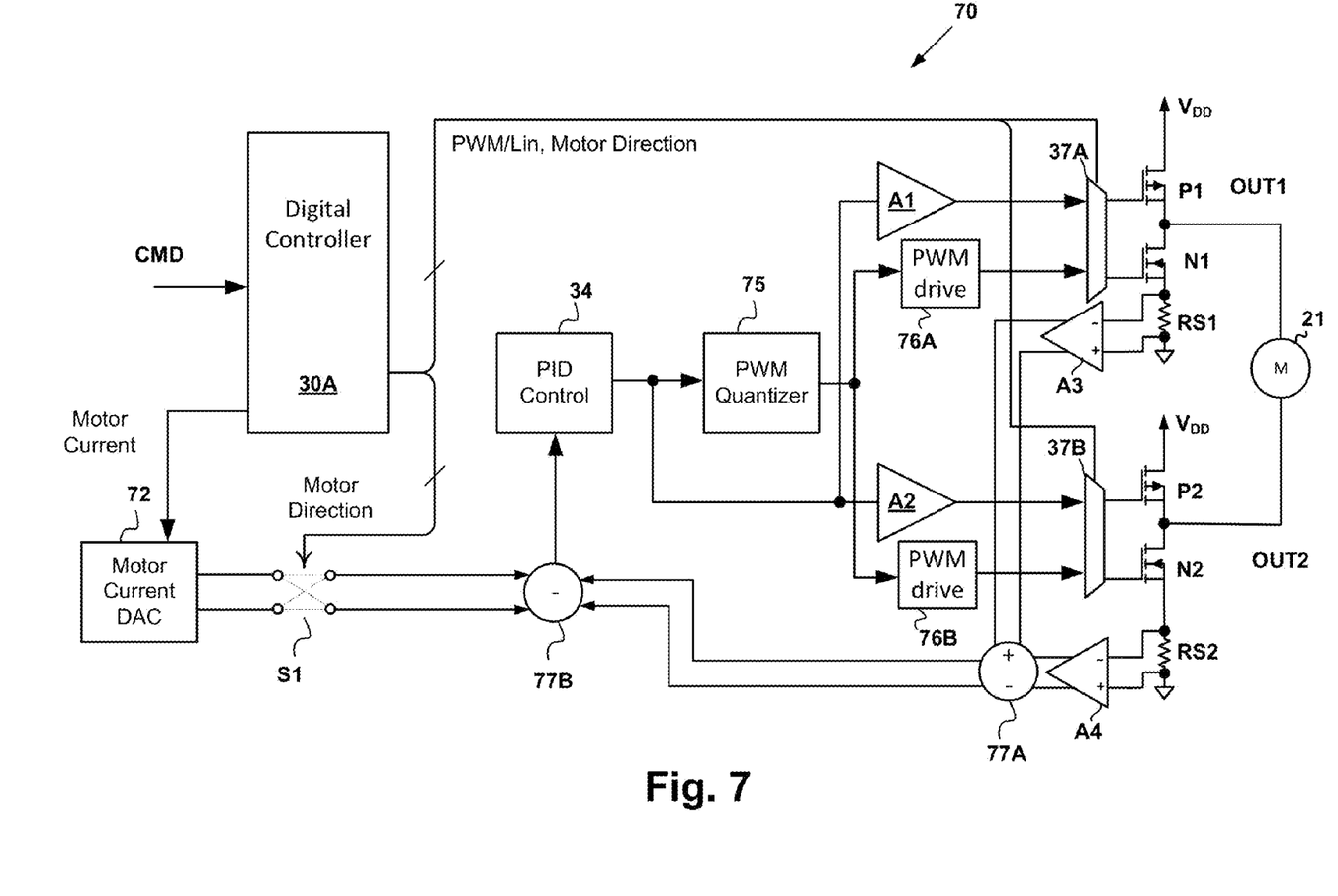
FIG. 7 is a simplified schematic diagram of an example motor controller circuit 70 that may be used to implement motor controller 20 of FIG. 1 and FIG. 2, in accordance with an embodiment of the disclosure.

Referring now to FIG. 7, a simplified schematic diagram of an example motor controller circuit 70 that may be used to implement motor controller 20 of FIG. 1 and FIG. 2 is shown, in accordance with an embodiment of the disclosure. An output driver circuit in the form of an H-bridge is formed by transistors P1, P2, N1 and N2. Each half of the H-bridge includes a current sense resistor RS1, RS2 that provide sense voltage inputs to fully-differential amplifiers A3 and A4, respectively. In the linear operating mode, the voltages across both sense resistors RS1, RS2 are measured by fully-differential amplifiers A3 and A4 and are subtracted by a combiner 77A, which causes cancelation of measured class-AB bias current conducted by both sides of the H-bridge, while the motor current remains in the measurement, since only one of transistors N1 or N2 is conducting the motor current. In some embodiments, as described in U.S. Patent Application Publication US20220337181, the disclosure of which is incorporated herein by reference, in PWM mode, the motor current may be sensed on the "sink" side, i.e., through the sense resistor RS1 or RS2 that is connected to one of transistors N1 or N2 that is turned on to sink current provided through motor 21 from the other side of the H-bridge. In such embodiments, the current is provided from a direction that is selected depending on the state of a control signal Motor Direction provided from a digital control 30A and that selects one side of the H-bridge to operate statically, while the other side of the H-bridge is pulse-width modulated. In other embodiments, both sides of the H-bridge may be modulated.

Input to example motor controller 70, is generally provided from CPU 17 or image processor 13 of FIG. 1, or both, to digital control 30A. A motor current command, which is indicated by a command input CMD, includes a digital input value Motor Current provided to a motor current digital-to-analog converter (DAC) 72 that is coupled through crosspoint switch S1, which interchanges the output signals of motor current DAC 72 to provide negative values corresponding to a reverse motor direction when control signal Motor Direction is asserted. Control signal PWM/Lin, which is generated according to the state machine operation described above, is sent to select linear or PWM operating mode. Control signal PWM/Lin sets the PWM operating mode when asserted and sets the linear operating mode when de-asserted. A combiner 77B generates feedback signals from a differential output of combiner 77A, which is subtracted from the direction-corrected motor current command value provided from switch S1, also as a differential voltage, which sets a commanded motor current level by generating the output of combiner 77B as a motor current error level, i.e., the difference between the current being delivered to motor 21 and the current commanded by motor current DAC 72. The output of combiner 77B is provided as an input to a proportional integral-derivative (PID) control block 31. PID control block 34 corrects for the phase difference between the motor current through the inductive load of motor 21 and the voltage across motor 21, and generates an output that provides an input to a PWM quantizer 75, which generates PWM output signals that provide input to a pair of PWM drive blocks 76A and 76B. The outputs of PWM drive blocks 76A, 76B are provided as inputs to respective selector blocks 37A, 37B. Selector blocks 37A, 37B select between providing the output of one of PWM drive blocks 76A, 76B to a side of the H-bridge that is being modulated when a control signal PWM/Lin is asserted, while enabling the N-channel transistor N1 or N2 on the other side of H-bridge to conduct the current returning from motor 21 to the power supply return. The P-channel transistor P1 or P2 on the non-modulated side of the H-bridge is turned off by the corresponding one of selector blocks 37A, 37B or by an external pull-up configuration (not shown).

In the linear operating mode, as selected by digital controller 30 de-asserting control signal PWM/Lin, the outputs of both of a pair of linear driver amplifiers A1, A2 are coupled to their corresponding side of the H-bridge. Linear driver amplifiers A1, A2 also receive the output of PID control block 31, so that a common feedback loop may be shared between linear and PWM mode drive. Linear driver amplifiers A1, A2 have a gain that compensates for the difference between the single-ended PWM signal generated by only one half of the H-bridge vs. the differential signaling during operation of the H-bridge in linear mode, e.g., an attenuation of ½.

As mentioned above, portions of the disclosed processes may be carried out by the execution of a collection of program instructions forming a computer program product stored on a non-volatile memory, but that also exist outside of the non-volatile memory in tangible forms of storage forming a computer-readable storage medium. The computer-readable storage medium may be, for example, but is not limited to, an electronic storage device, a magnetic storage device, an optical storage device, an electromagnetic storage device, a semiconductor storage device, or any suitable combination of the foregoing. Specific examples of the computer-readable storage medium includes the following: a hard disk, semiconductor volatile and non-volatile memory devices, a portable compact disc read-only memory (CD-ROM) or a digital versatile disk (DVD), a memory stick, a floppy disk or other suitable storage device not specifically enumerated. A computer-readable storage medium, as used herein, is not to be construed as being transitory signals, such as transmission line or radio waves or electrical signals transmitted through a wire. It is understood that blocks of the block diagrams described above may be implemented by computer-readable program instructions. These computer readable program instructions may also be stored in other storage forms as mentioned above and may be downloaded into a non-volatile memory for execution therefrom. However, the collection of instructions stored on media other than system non-volatile memory described above also form a computer program product that is an article of manufacture including instructions which implement aspects of the functions/actions specified in the block diagram block or blocks.

In summary, this disclosure shows and describes systems and integrated circuits implementing an electronic control system, and their methods of operation. In some example embodiments, the system is a system for supplying a current or a voltage to a load in response to an input signal or value and includes an output driver for supplying the current or the voltage to the load. The system may include a first control path that receives the input signal or value and has an output coupled to an input of the output driver, a second control path that receives the input signal or value and has an output coupled to an input of the output driver, and a control circuit that selects between the first control path and the second control path in response to a path selection indication to provide the output to the input of the output driver. In some example embodiments, the system includes an evaluator that receives the input signal or value and determines the path selection indication in conformity with an amplitude and a slew rate of the input signal or value. In some example embodiments, at least one of the first control path or the second control path has a response time to changes in the input signal or value, and the control circuit delays switching from the second control path to the first control path to compensate for the response time.

In some example embodiments, the system may further include a waveform generation circuit for generating the input signal or value as an output provided to the first control path, and the waveform generation circuit may receive command values and may generate the input signal or value as a sequence of segments commencing at start points and ending at end points and a transition ramp extending from each start point to a hold point occurring before the corresponding end point, so that a value of the input signal or value may be held at the corresponding hold point until the next start point occurs. In some example embodiments, the first control path may be a pulse-width modulated control path and the second control path may be a linear control path, and the control circuit may receive a new end point of a next one of the segments having a start point equal to the end point of a current segment, and may, depending on a difference between the input signal or value at a start point of the next segment and the input signal of value at the hold point of the current segment, selectively override a one or more new determined path selection indications during the next segment.

In some example embodiments, the evaluator may determine the path selection indication in conformity with the input signal or value during the ramp portion of the segments, such that the determined path selection indication selectively changes during the segments, and the control circuit may selectively override one or more new determined path selection indications during the ramp portion of the segments to prevent a change during segments having particular characteristics. In some example embodiments, a current path selection indication may select the pulse-width modulated control path, a path selection indication determined for a next hold point may select the pulse-width modulated control path, and the control circuit may determine whether or not a polarity of the input signal or value at a current hold point and the input signal or value at the next hold point have the same polarity. The control circuit may, responsive to determining that the input signal or value has the same polarity at the current hold point and the next hold point, maintain the selection of the pulse-width modulated control path independent of the input signal or value between the current hold point and the next hold point.

In some example embodiments, the current path selection indication may select the pulse-width modulated control path, the determined path selection indication for the next hold point selects the pulse-width modulated control path, the control circuit may determine whether or not a polarity of the input signal or value at a current hold point and the input signal or value at the next hold point have the same polarity, and the control circuit may, responsive to determining that the input signal or value does not have the same polarity at the current hold point and the next hold point, change the path selection indication to select the linear operating mode and may maintain selection of the linear operating mode to the next hold point and an additional delay beyond the next hold point has expired. The current path selection indication may select the linear control path, the determined path selection indication for the next hold point may select the pulse-width modulated control path, and the control circuit may maintain the path selection indication to select the linear operating mode throughout the next transition ramp and may change the path selection indication to select the pulse-width modulated operating mode only after the next hold point has been reached and an additional delay beyond the next hold point has expired.

In some example embodiments, at least one of the first control path or the second control path has a response time to changes in the input signal or value, and wherein the control circuit delays switching from the second control path to the first control path to compensate for the response time. In some example embodiments, the response time may be a delay between the evaluator determining the path selection indication and changes in the input signal or value appearing at the input of the driver. In some example embodiments, at least one of the first control path or the second control path includes a proportional-integral-derivative (PID) control block, and the control circuit may compensate for a response delay of the PID control block by delaying the path selection indication by a time equal or greater than the delay introduced by the PID control block.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to a control system for supplying signals to a haptic device or an audio transducer.

What is claimed is:

1. A system for supplying a current or a voltage to a load in response to an input signal or value, comprising:
   an output driver for supplying the current or the voltage to the load;
   a first control path that receives the input signal or value and has an output coupled to an input of the output driver;
   a second control path that receives the input signal or value and has an output coupled to the input of the output driver;
   a control circuit that selects between the first control path and the second control path in response to a path selection indication to provide the output to the input of the output driver; and
   an evaluator that receives the input signal or value and determines the path selection indication conditioned on both of an amplitude and a slew rate at which the input signal or value is transitioning to a next value.

2. The system of claim 1, further comprising a waveform generation circuit for generating the input signal or value as an output provided to the first control path, wherein the waveform generation circuit receives command values and generates the input signal or value as a sequence of segments commencing at start points and ending at end points and a transition ramp extending from each start point to a hold point occurring before the corresponding end point, wherein a value of the input signal or value is held at the corresponding hold point until the next start point occurs.

3. The system of claim 2, wherein the first control path is a pulse-width modulated control path and wherein the second control path is a linear control path, and wherein the control circuit receives a new end point of a next one of the segments having a start point equal to the end point of a current segment, and, depending on a difference between the input signal or value at a start point of the next segment and the input signal of value at the hold point of the current segment, selectively overrides a one or more new determined path selection indications during the next segment.

4. The system of claim 3, wherein the evaluator further determines the path selection indication in conformity with the input signal or value during the ramp portion of the segments, such that the determined path selection indication selectively changes during the segments, and wherein the control circuit selectively overrides one or more new determined path selection indications during the ramp portion of the segments to prevent a change during segments having particular characteristics.

5. The system of claim 4, wherein a current path selection indication selects the pulse-width modulated control path, wherein a path selection indication determined for a next hold point selects the pulse-width modulated control path, wherein the control circuit determines whether or not a polarity of the input signal or value at a current hold point and the input signal or value at the next hold point have the same polarity, and wherein the control circuit, responsive to determining that the input signal or value has the same polarity at the current hold point and the next hold point, maintains the selection of the pulse-width modulated control path, independent of the input signal or value between the current hold point and the next hold point.

6. The system of claim 5, wherein the current path selection indication selects the pulse-width modulated control path, wherein the determined path selection indication for the next hold point selects the pulse-width modulated control path, and wherein the control circuit determines whether or not a polarity of the input signal or value at a current hold point and the input signal or value at the next hold point have the same polarity, and wherein the control circuit, responsive to determining that the input signal or value does not have the same polarity at the current hold point and the next hold point, changes the path selection indication to select the linear operating mode and maintains selection of the linear operating mode to the next hold point and an additional delay beyond the next hold point has expired.

7. The system of claim 6, wherein the current path selection indication selects the linear control path, wherein the determined path selection indication for the next hold point selects the pulse-width modulated control path, and wherein the control circuit maintains the path selection indication to select the linear operating mode throughout the next transition ramp and changes the path selection indication to select the pulse-width modulated operating mode only after the next hold point has been reached and an additional delay beyond the next hold point has expired.

8. The system of claim 4, wherein the current path selection indication selects the pulse-width modulated control path, wherein the determined path selection indication for the next hold point selects the pulse-width modulated control path, and wherein the control circuit determines whether or not a polarity of the input signal or value at a current hold point and the input signal or value at the next hold point have the same polarity, and wherein the control circuit, responsive to determining that the input signal or value does not have the same polarity at the current hold point and the next hold point, changes the path selection indication to select the linear operating mode and maintains selection of the linear operating mode to the next hold point and an additional delay beyond the next hold point has expired.

9. The system of claim 5, wherein the current path selection indication selects the linear control path, wherein the determined path selection indication for the next hold point selects the pulse-width modulated control path, and wherein the control circuit maintains the path selection indication to select the linear operating mode throughout the next transition ramp and changes the path selection indication to select the pulse-width modulated operating mode only after the next hold point has been reached and an additional delay beyond the next hold point has expired if the determined path selection for the next hold point.

10. A system for supplying a current or a voltage to a load in response to an input signal or value, comprising:
    an output driver for supplying the current or the voltage to the load;
    a pulse-width modulated control path that receives the input signal or value and has an output coupled to an input of the output driver;
    a linear control path that receives the input signal or value and has an output coupled to the input of the output driver; and
    a control circuit that selects between the pulse-width modulated control path and the linear control path in response to a path selection indication to provide the output to the input of the output driver, wherein the linear control path has a circuit response time to changes in the input signal or value, and wherein the control circuit delays switching from the linear control path to the pulse-width modulated control path to compensate for the circuit response time.

11. The system of claim 10, further comprising an evaluator that receives the input signal or value and determines the path selection indication in conformity with an amplitude and a slew rate of the input signal or value, and wherein the response time is a delay between the evaluator determining the path selection indication and changes in the input signal or value appearing at the input of the driver.

12. The system of claim 10, wherein the linear control path includes a proportional-integral-derivative (PID) control block, and wherein the control circuit compensates for a response delay of the PID control block by delaying the path selection indication by a time equal or greater than the delay introduced by the PID control block.

13. A method of controlling a multi-path system for supplying a current or a voltage to a load in response to an input signal or value, the method comprising:
    supplying the current or the voltage to the load from an output driver;
    receiving the input signal or value a first control path that has an output coupled to an input of the output driver;

receiving the input signal or value at a second control path that has an output coupled to the input of the output driver;

selecting between the first control path and the second control path in response to a path selection indication to provide the output to the input of the output driver; and determining the path selection indication conditioned on both of an amplitude and a slew rate at which the input signal or value is transitioning to a next value.

14. The method of claim 13, further comprising generating the input signal or value as an output provided to the first control path by:

receiving command values; and generating the input signal or value as a sequence of segments commencing at start points and ending at end points and a transition ramp extending from each start point to a hold point occurring before the corresponding end point, wherein a value of the input signal or value is held at the corresponding hold point until the next start point occurs.

15. The method of claim 14, wherein the first control path is a pulse-width modulated control path and wherein the second control path is a linear control path, and wherein the receiving command values receives a new end point of a next one of the segments having a start point equal to the end point of a current segment, and wherein the method further comprises:

determining a difference between the input signal or value at a start point of the next segment and the input signal of value at the hold point of the current segment; and depending on the difference between the input signal or value at a start point of the next segment and the input signal of value at the hold point of the current segment, selectively overriding a one or more new determined path selection indications during the next segment.

16. The method of claim 15, wherein the determining of the path selection indication in conformity with the input signal or value is applied to the ramp portion of the segments, such that the determined path selection indication selectively changes during the segments, and wherein the selectively overriding overrides the one or more new determined path selection indications during the ramp portion of the segments to prevent a change during segments having particular characteristics.

17. The method of claim 16, wherein a current path selection indication selects the pulse-width modulated control path, wherein a path selection indication determined for a next hold point selects the pulse-width modulated control path, wherein the method further comprises determining whether or not a polarity of the input signal or value at a current hold point and the input signal or value at the next hold point have the same polarity, and wherein the selectively overriding, responsive to determining that the input signal or value has the same polarity at the current hold point and the next hold point, maintains the selection of the pulse-width modulated control path, independent of the input signal or value between the current hold point and the next hold point.

18. The method of claim 17, wherein the current path selection indication selects the pulse-width modulated control path, wherein the determined path selection indication for the next hold point selects the pulse-width modulated control path, and wherein the method further comprises determining whether or not a polarity of the input signal or value at a current hold point and the input signal or value at the next hold point have the same polarity, and wherein the selectively overriding, responsive to determining that the input signal or value does not have the same polarity at the current hold point and the next hold point, changes the path selection indication to select the linear operating mode and maintains selection of the linear operating mode to the next hold point and an additional delay beyond the next hold point has expired.

19. The method of claim 18, wherein the current path selection indication selects the linear control path, wherein the determined path selection indication for the next hold point selects the pulse-width modulated control path, and wherein the selectively overriding maintains the path selection indication to select the linear operating mode throughout the next transition ramp and changes the path selection indication to select the pulse-width modulated operating mode only after the next hold point has been reached and an additional delay beyond the next hold point has expired if the determined path selection for the next hold point.

20. A method of controlling a circuit that supplies a current or a voltage to a load in response to an input signal or value, the method comprising:

supplying the current or the voltage to the load from an output driver;

receiving the input signal or value by a pulse-width modulated control path that has an output coupled to an input of the output driver;

receiving the input signal or value at a linear control path that has an output coupled to the input of the output driver;

selecting between the pulse-width modulated first control path and the linear control path in response to a path selection indication to provide the output to the input of the output driver, wherein the linear control path has a circuit response time to changes in the input signal or value, and wherein the selecting delays switching from the linear control path to the pulse-width modulated control path to compensate for the response time.

21. The method of claim 20, further comprising determining the path selection indication in conformity with an amplitude and a slew rate of the input signal or value, and wherein the response time is a delay between the evaluator determining the path selection indication and changes in the input signal or value appearing at the input of the driver.

22. The method of claim 20, wherein the linear control path includes a proportional-integral-derivative (PID) control block, and wherein the selecting compensates for a response delay of the PID control block by delaying selection of the pulse-width-modulated control path by a time equal or greater than the delay introduced by the PID control block.

* * * * *

UNITED STATES PATENT AND TRADEMARK OFFICE
CERTIFICATE OF CORRECTION

PATENT NO. : 11,940,827 B1
APPLICATION NO. : 18/078292
DATED : March 26, 2024
INVENTOR(S) : Kenly et al.

It is certified that error appears in the above-identified patent and that said Letters Patent is hereby corrected as shown below:

In the Specification

In Column 6, Line 59, delete "time" and insert -- time $t_1$, --, therefor.

In Column 7, Line 11, delete "to" and insert -- $t_8$, --, therefor.

In Column 7, Line 23, delete "113." and insert -- $t_{13}$. --, therefor.

Signed and Sealed this
Fourth Day of June, 2024

*Katherine Kelly Vidal*

Katherine Kelly Vidal
*Director of the United States Patent and Trademark Office*